(12) United States Patent
Heo et al.

(10) Patent No.: US 11,008,430 B2
(45) Date of Patent: May 18, 2021

(54) POLARIZER PROTECTION FILM, POLARIZING PLATE COMPRISING SAME, AND DISPLAY PROVIDED WITH SAME

(71) Applicant: SKC CO., LTD., Gyeonggi-do (KR)

(72) Inventors: Young Min Heo, Gyeonggi-do (KR); Se Chul Lee, Gyeonggi-do (KR); Da Woo Jeong, Gyeonggi-do (KR); Jang Won Lee, Gyeonggi-do (KR)

(73) Assignee: SKC CO., LTD., Gyeonggi-do (KR)

( * ) Notice: Subject to any disclaimer, the term of this patent is extended or adjusted under 35 U.S.C. 154(b) by 299 days.

(21) Appl. No.: 16/305,797

(22) PCT Filed: May 29, 2017

(86) PCT No.: PCT/KR2017/005599
§ 371 (c)(1),
(2) Date: Nov. 29, 2018

(87) PCT Pub. No.: WO2017/209473
PCT Pub. Date: Dec. 7, 2017

(65) Prior Publication Data
US 2020/0326587 A1    Oct. 15, 2020

(30) Foreign Application Priority Data

May 31, 2016 (KR) .................. 10-2016-0067668
Jun. 13, 2016 (KR) .................. 10-2016-0073113
Jun. 20, 2016 (KR) .................. 10-2016-0076721
Jun. 22, 2016 (KR) .................. 10-2016-0078017

(51) Int. Cl.
*G02B 1/14* (2015.01)
*C08J 7/046* (2020.01)
*G02B 5/30* (2006.01)
*G02F 1/1335* (2006.01)
*C08J 7/048* (2020.01)

(52) U.S. Cl.
CPC ............... *C08J 7/046* (2020.01); *C08J 7/048* (2020.01); *G02B 1/14* (2015.01); *G02B 5/305* (2013.01); *G02F 1/133528* (2013.01)

(58) Field of Classification Search
CPC ........................................................ G02B 1/14
USPC .......................................................... 349/56
See application file for complete search history.

(56) References Cited

U.S. PATENT DOCUMENTS

2017/0363778 A1* 12/2017 Lee ..................... G02B 1/04
2017/0363779 A1* 12/2017 Lee ..................... G02B 5/3025

FOREIGN PATENT DOCUMENTS

| JP | 2006301570 | 11/2006 |
| JP | 2010107892 | 5/2010 |
| JP | 2011-112928 A | 6/2011 |
| JP | 2011-202156 A | 10/2011 |
| JP | 2011248036 | 12/2011 |
| JP | 2011252129 | 12/2011 |

(Continued)

OTHER PUBLICATIONS

Office Action issued by Japanese Patent dated Jan. 28, 2020.

(Continued)

*Primary Examiner* — Christopher M Raabe
(74) *Attorney, Agent, or Firm* — IP & T Group LLP (57) ABSTRACT

Disclosed are a protective film for a polarizer with superior optical and mechanical properties, a polarizing plate including the same and a display device including the same.

19 Claims, 4 Drawing Sheets

(56) References Cited

FOREIGN PATENT DOCUMENTS

| | | |
|---|---|---|
| JP | 2012025070 | 2/2012 |
| JP | 2012203332 | 10/2012 |
| JP | 2012-220879 A | 11/2012 |
| JP | 2015-72376 A | 4/2015 |
| JP | 2015102655 | 6/2015 |
| JP | 2015-184664 A | 10/2015 |
| JP | 2016-71347 A | 5/2016 |
| KR | 1020140140770 | 12/2014 |
| KR | 1020150043641 | 4/2015 |
| KR | 1020160053955 | 5/2016 |
| WO | 2007/020909 A1 | 2/2007 |
| WO | 2007/066514 A1 | 6/2007 |
| WO | 2013/133064 A1 | 9/2013 |
| WO | WO-2015146883 A1 * | 10/2015 ........... B29C 55/143 |
| WO | WO-2016167405 A1 * | 10/2016 ........... G02F 1/1335 |

OTHER PUBLICATIONS

Office Action issued by the Korean Intellectual Property Office dated Sep. 29, 2016.
Office Action issued by the Korean Intellectual Property Office dated Jun. 20, 2017.

* cited by examiner

POLARIZER PROTECTION FILM, POLARIZING PLATE COMPRISING SAME, AND DISPLAY PROVIDED WITH SAME

This application is a national stage application of PCT/KR2017/005599 filed on May 29, 2017, which claims priority of Korean patent application numbers 10-2016-0067668 filed on May 31, 2016, 10-2016-0073113 filed on Jun. 13, 2016, 10-2016-0076721 filed on Jun. 20, 2016, and 10-2016-0078017 filed on Jun. 22, 2016. The disclosure of each of the foregoing applications is incorporated herein by reference in its entirety.

TECHNICAL FIELD

The present invention relates to a protective film for a polarizer with superior optical and mechanical properties, a polarizing plate including the same and a display device including the same.

BACKGROUND ART

Recently, interests in a polarizing plate, an essential component of a liquid crystal display (LCD), are increasing as the demand on the liquid crystal display increases rapidly.

The polarizing plate, which polarizes incident natural light oscillating in various directions into light oscillating in one direction only, is an essential component for providing transmitted light and changing the color tone of the transmitted light.

The polarizing plate has a structure in which a protective film is stacked on one or both sides of a polarizer. As the polarizer, polyvinyl alcohol (PVA) is commonly used. In the past, triacetyl cellulose (TAC) was commonly used as the protective film.

Meanwhile, as the functions and applications of the liquid crystal display (LCD) become more diversified, normal operation is required even under harsh conditions. However, triacetyl cellulose (TAC) does not satisfy this requirement because it is vulnerable to moisture and has weak durability.

Recently, there have been many attempts to replace the triacetyl cellulose (TAC) with polyethylene terephthalate (PET) as in Japanese Patent Publication No. 2011-532061 and Japanese Patent Publication No. 2010-118509. It is because polyethylene terephthalate (PET) can satisfy the above requirement due to its superior mechanical property, chemical resistance and moisture barrier property.

However, because polyethylene terephthalate (PET) is highly birefringent, it leads to distorted polarization between the polarizer and the liquid crystal and, accordingly, significantly reduces visibility. A typical example is the rainbow stains appealing on the surface of the protective film.

Because the rainbow stains become easily visible due to the recent trend of high brightness and high color purity of the liquid crystal display (LCD), the rainbow stains are a big obstacle to use of the polyethylene terephthalate (PET) for the protective film.

DISCLOSURE OF INVENTION

Technical Problem

The present invention has been made to resolve the above-described problems and limitations.

The present invention is directed to providing a protective film for a polarizer, which is free from rainbow stains, a polarizing plate including the same and a display device including the same.

The present invention is also directed to providing a protective film which has good mechanical property such as crystallinity, tensile strength, pencil hardness, etc. without impairing visibility due to superior optical property, a polarizer including the same and a display device including the same.

The objects of the present invention are not limited to those described above. The objects of the present invention will become apparent from the following description and may be realized by the means described in the appended claims and combinations thereof.

Solution to Problem

A protective film for a polarizer according to an exemplary embodiment may contain polyethylene terephthalate (PET), satisfy the conditions of (1) and (2):

(1) in-plane phase difference ($R_o$) ≤350 nm
(2) phase difference in thickness direction ($R_{th}$) ≥6,000 nm, and have a crystallinity of 35% to 55%.

A protective film for a polarizer according to an exemplary embodiment may have a density of 1.3 $g/cm^3$ to 1.5 $g/cm^3$.

A protective film for a polarizer according to an exemplary embodiment may have a tensile modulus (85° C.) of 3.0 GPa to 5.0 GPa.

A protective film for a polarizer according to an exemplary embodiment may have a difference of a modulus (85° C.) in the width direction (TD)) and a modulus (85° C.) in the length direction (MD) of smaller than 0.3 GPa.

A protective film for a polarizer according to an exemplary embodiment may have a pencil hardness of 5B or greater.

A protective film for a polarizer according to an exemplary embodiment may have an in-plane phase difference ($R_o$) at the width center of 200 nm or smaller.

A protective film for a polarizer according to an exemplary embodiment may have a phase difference in thickness direction ($R_{th}$) at the width center or 6,800 nm or greater.

A protective film for a polarizer according to an exemplary embodiment may have a ratio ($R_{th}/R_o$) of the phase difference in thickness direction ($R_{th}$) with respect to the in-plane phase difference ($R_o$) at the width center of 60 or greater.

A protective film for a polarizer according to an exemplary embodiment may have a variation of the in-plane phase difference ($R_{o,max}-R_{o,min}$) within the effective width of 250 nm/m or smaller.

A protective film for a polarizer according to an exemplary embodiment may have a variation of the phase difference in thickness direction ($R_{th,max}-R_{th,min}$) within the effective width of 1,500 nm/m or smaller.

A protective film for a polarizer according to an exemplary embodiment may experience a change in the in-plane phase difference with respect to the width change ($|\Delta R_o|/|\Delta x|$) within the effective width of smaller than 0.3 nm/mm.

A protective film for a polarizer according to an exemplary embodiment may experience a change in the phase difference in thickness direction with respect to the width change ($|\Delta R_{th}|/|\Delta x|$) within the effective width of smaller than 1.5 nm/mm.

A protective film for a polarizer according to an exemplary embodiment may have a stretching ratio in the length direction (MD) of 2.8 times to 3.5 times and a stretching ratio in the width direction (TD) of 2.9 times to 3.7 times.

A protective film for a polarizer according to an exemplary embodiment may have a ratio (MD/TD) of a stretching ratio in the length direction (MD respect to a stretching ratio in the width direction (TD) of 0.9 to 1.1.

A protective film for a polarizer according to an exemplary embodiment may have a thickness of 20 μm to 60 μm.

A protective film for a polarizer according to an exemplary embodiment may have a heat setting temperature of 160° C. to 230° C.

A polarizing plate according to an exemplary embodiment may include a polarizer and the protective film for a polarizer described above which is adjacent to at least one of the upper side and the lower side of the polarizer.

A polarizing plate according to an exemplary embodiment may further include a hard coating layer formed on the protective film and may have a pencil hardness of 1H or greater.

A display device according to an exemplary embodiment may include a display panel and the polarizing plate described above which is disposed on at least one of the upper side and the lower side of the display panel.

Advantageous Effects of Invention

The present invention provides the following effects.

A protective film for a polarizer according to an exemplary embodiment and a polarizing plate including the same do not impair visibility because they are free from rainbow stains and have good durability due to superior mechanical property such as tensile strength, pencil hardness, etc.

Accordingly, a display device equipped with the polarizing plate according to an exemplary embodiment can be used in various applications because it has superior optical property and can be operated normally even under harsh environment.

The effects of the present invention are not limited to those described above. It is to be understood that the effects of the present invention include all the effects that can be inferred from the following description.

BRIEF DESCRIPTION OF DRAWINGS

FIGS. 5(a)-5(c) show a result of measuring in-plane phase difference ($R_o$) for the entire effective width of a protective film of Example 1. FIG. 5 shows results for the entire effective width (a), the range from 0 mm (width center) to −1,500 mm (b) and the range from 0 mm (width center) to +1,500 mm (c).

FIGS. 6(a)-6(c) show a result of measuring phase difference in the thickness direction ($R_{th}$) for the entire effective width of a protective film of Example 1. FIG. 6 shows results for the entire effective width (a), the range from 0 mm (width center) to −1,500 mm (b) and the range from 0 mm (width center) to +1,500 mm (c).

BEST MODE FOR CARRYING OUT THE INVENTION

Hereinafter, the present invention is described in detail by exemplary embodiments. The exemplary examples can be modified in various forms within the scope of the present invention and scope of the present invention is not limited by the exemplary embodiments.

In the exemplary embodiments described below, a film, a membrane, a panel, a layer, etc. formed "on" or "under" a film, a membrane, a panel, a layer, etc. may be formed either "directly" or "indirectly with another component disposed therebetween".

In the attached drawings, the components may be magnified in size for the purpose of illustration.

Figure 1:
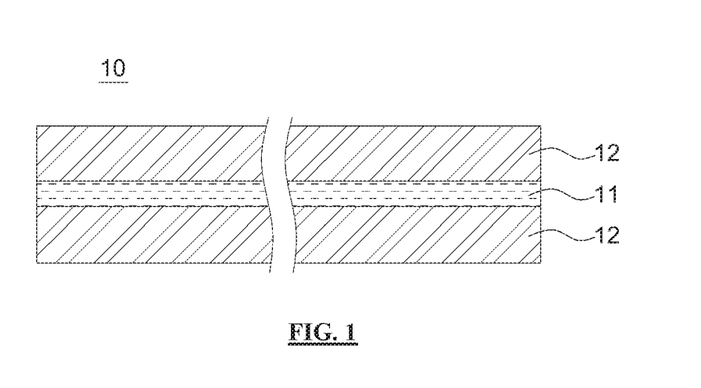
FIG. 1 briefly illustrates a polarizing plate according to an exemplary embodiment.

FIG. 1 briefly illustrates a polarizing plate 10 according to an exemplary embodiment.

The polarizing plate 10 according to an exemplary embodiment includes a polarizer 11 and a protective film 12 for a polarizer (hereinafter, a 'protective film') which is adjacent to at least one of the upper side and the lower side of the polarizer 11.

The polarizer 11 polarizes natural light incident on the polarizing plate while oscillating in various directions into light oscillating in one direction only.

The polarizer may be polyvinyl alcohol (PVA) doped with iodine, etc. Polyvinyl alcohol (PVA) molecules contained in the polarizer may be arranged along one direction.

Specifically, the protective film 12 may be formed from a material having superior mechanical property. Accordingly, the protective film may be formed from a material having polyester as a main component. By crystallizing the polyester by performing heating, stretching, etc., crystallinity can be increased and, through this, mechanical property such as tensile strength, etc. may be enhanced.

In addition, the polyester may improve the durability of the polarizing plate under humid environment because it has lower water vapor permeability than triacetyl cellulose (TAC).

As the polyester, a homopolymer obtained from polycondensation of a dicarboxylic acid such as terephthalic acid, isophthalic acid, ortho-phthalic acid, 2,5-naphthalenedicarboxylic acid, 2,6-naphthalenedicarboxylic acid, 1,4-naphthalenedicarboxylic acid, 1,5-naphthalenedicarboxylic acid, diphenylcarboxylic acid, diphenoxyethaedicarboxylic acid, diphenylsulfonecarboxylic acid, anthracenedicarboxylic acid, 1,3-cyclpentanedicarboxylic acid, 1,3-cyclohexanedicarboxylic acid, 1,4-cyclohexanedicarboxylic acid, hexahydroterephthalic acid, hexahydroisophthalic acid, malonic acid, dimethylmalonic acid, succinic acid, 3,3-diethylsuccinic acid, glutaric acid, 2,2-dimethylglutaric acid, adipic acid, 2-methyladipic acid, trimethyladipic acid, pimelic acid, azelaic acid, dimer acid, sebacic acid, suberic acid, dodecanedicarboxylic acid, etc. or a diol such as ethylene glycol, propylene glycol, hexamethylene glycol, neopentyl 1,2-cyclohexanedimethanol, 1,4-cyclohexanedimethanol, decamethylene glycol, 1,3-propanediol, 1,4-butanediol, 1,5-pentanediol, 1,6-hexanediol, 2,2-bis(4-hydroxyphenyl)propane, bis(4-hydroxyphenyl)sulfone, etc., a copolymer obtained from polycondensation of one or more dicarboxylic acid and two or more diols, a copolymer obtained from polycondensation of two or more dicarboxylic acids and one or greater diol or a blend resin obtained from blending of two or more of the homopolymer or the copolymer may be used.

Specifically, an aromatic polyester may be used considering the crystallinity of the polyester. Most specifically, polyethylene terephthalate (hereinafter, 'PET') may be used.

However, the PET may not be suitable for use as the protective film because it lacks crystallinity in an unstretched state. Accordingly, biaxially stretched PET may be used as the protective film.

The PET may be biaxially stretched along a width direction (transverse direction, TD) and a length direction (machine direction, MD) through simultaneous biaxial stretching or sequential biaxial stretching. Specifically, the PET may be biaxially stretched sequentially by stretching along one direction and then stretching along a direction perpendicular thereto, although not being limited thereto.

Although the PET has superior mechanical property and moisture barrier property, it may distort polarization when used in the protective film as it is due to very high birefringence. A typical example is the rainbow stains described above.

Accordingly, in the present invention, the optical property of the PET is improved to prevent the rainbow stains so that it is suitable to be used for the protective film. A detailed description is given below.

The protective film satisfies the following conditions (1) and (2).

Figure 2:
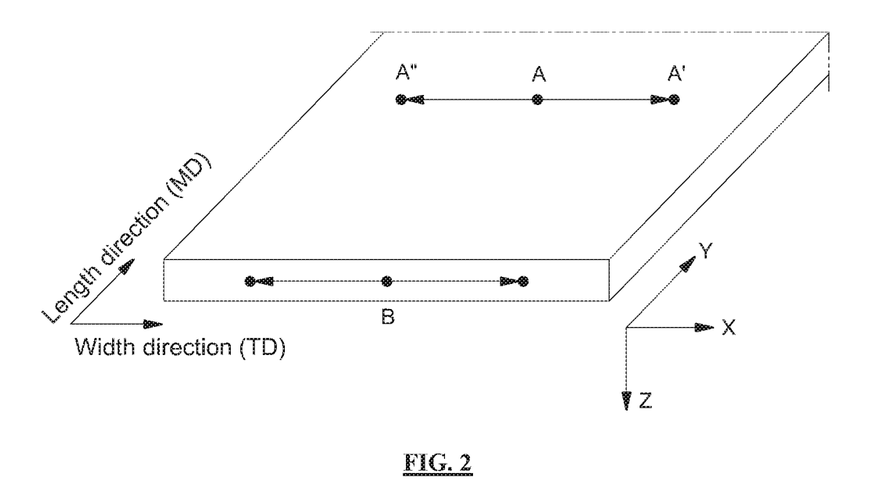
FIG. 2 is a reference diagram for describing a protective film for a polarizer according to an exemplary embodiment.

(1) in-plane phase difference ($R_o$) ≤350 nm
(2) phase difference in thickness direction ($R_{th}$) ≥6,000 nm In-Plane Phase Difference ($R_o$) of Protective Film The in-plane phase difference ($R_o$) is a parameter defined as the anisotropy of refractive indices ($\Delta N_{xy}=|N_x-N_y|$) in two perpendicular axes on the protective film (see FIG. 2) times the thickness d of the protective film, i.e., $\Delta N_{xy} \times d$, and is a measure of optical isotropy and anisotropy.

$$\text{In-Plane Phase Difference } R_o \text{ [nm]}=(N_x-N_y) \times d$$

wherein $N_x$ is the refractive index of the protective film in the width direction, $N_y$ is the refractive index of the protective film in the length direction and d is the thickness of the protective film.

Specifically, the in-plane phase difference ($R_o$) of the protective film may be 350 nm or smaller. If the in-plane phase difference ($R_o$) increases, the occurrence of rainbow stains becomes severe. Therefore, the smaller the in-plane phase difference, the better. However, because stretching ratio or thickness has to be decreased to reduce the in-plane phase difference of PET, mechanical property may worsen. Accordingly, for balanced optical property and mechanical property, the lower limit of the in-plane phase difference ($R_o$) may be set to be 10 nm or greater, specifically 30 nm or greater, more specifically 50 nm or greater.

As described above, it is easier to prevent the occurrence of rainbow stains as the in-plane phase difference ($R_o$) is smaller. Accordingly, the in-plane phase difference ($R_o$) at the width center of the protective film may be 200 nm or smaller.

In the present disclosure, the 'width center' is defined as the midpoint (A, B) of the width of the protective film after being stretched in the width direction (TD) and the length direction (MD), as shown in FIG. 2. The width center is not present singularly in the protective film but may be present in numerous numbers depending on the measurement site.

In the present disclosure, the 'effective width' which will be described below refers to the length in the width direction required for the protective film to be applicable for a polarizing plate for large-screen applications. Specifically, it refers to the distance between the positions (A', A") that have been moved from the width center (A) along the x-axis toward both ends, as shown in FIG. 2. In an exemplary embodiment, it is defined as ±1,500 mm from the width center, i.e., about 3,000 mm.

The protective film may have a variation in the in-plane phase difference ($R_{o,max}-R_{o,min}$) within the effective width of 250 nm/m or smaller, more specifically 167 nm/m or smaller. The variation in the in-plane phase difference is the difference between the maximum ($R_{o,max}$) and the minimum ($R_{o,min}$) of the in-plane phase difference per meter (m) within the effective width. If the variation in the in-plane phase difference is small, the occurrence of rainbow stains can be prevented effectively because the in-plane phase difference ($R_o$) does not increase significantly even when the width of the protective film is large.

The protective film may experience a change in the in-plane phase difference with respect to the width change within the effective width ($|\Delta R_o|/|\Delta x|$) of less 0.3 nm/mm. The width change refers to the distance between given points along the x-axis ($\Delta x=x_2-x_1$) and the change in the in-plane phase difference refers to the change n the in-plane phase difference at the given points ($\Delta R_o=R_{o,2}-R_{o,1}$). In the present disclosure, although the unit of the change in the in-plane phase difference with respect to the width change is specified as nm/mm, it does not necessarily mean that the change in the in-plane phase difference is measured based on the distance between two points in mm unit. For example, the change in the in-plane phase difference with respect to the width change may be determined by measuring the change in the in-plane phase difference for $\Delta x$ set to 1 mm, 1 cm or 10 cm and then converting it to the mm unit. The change in the in-plane phase difference with respect to the width change may refer to a mean if the change in the in-plane phase difference in the given range $\Delta x$, the change in the in-plane phase difference at both ends of the $\Delta x$ or the slope of a tangent line at a given point of a plot of the in-plane phase difference versus $\Delta x$. By controlling such that the change in the in-plane phase difference with respect to the width change is small, the in-plane phase difference ($R_o$) may be prevented from increasing significantly within the effective width.

Accordingly, it is desired that the protective film has the in-plane phase difference ($R_o$) at the width center of 200 nm or smaller, the in-plane phase difference ($R_o$) within ±500 mm from the width center along the width direction of 250 nm or smaller and the in-plane phase difference ($R_o$) within ±1000 mm from the width center along the width direction of 300 nm or smaller while satisfying the condition (1).

Phase Difference in Thickness Direction ($R_{th}$) of Protective Film

The phase difference in the thickness direction ($R_{th}$) is a parameter representing the mean of phase difference which is obtained by two birefringences $\Delta N_{xz}(=|N_x-N_z|)$ and $\Delta N_{yz}(=|N_y-N_z|)$ seen from the cross section of the protective film times the thickness d of the protective film.

$$\text{Phase Difference in Thickness Direction } (R_{th}) \text{ [nm]}= [(N_x-N_y)/2-N_z] \times d$$

wherein $N_x$ is the refractive index of the protective film in the width direction, $N_y$ is the refractive index of the protective film in the protective film, $N_z$ is the refractive index of the protective film in the thickness direction and d is the thickness of the protective film.

Specifically, the protective film may have a phase difference in the thickness direction ($R_{th}$) of 6,000 nm or greater. If the phase difference in the thickness direction ($R_{th}$) is large, crystallization is accelerated because the degree of molecular orientation in the protective film is large. Therefore, it is desired that the phase difference in the thickness direction ($R_{th}$) is large in the aspect of mechanical property. In addition, as the phase difference in the thickness direction ($R_{th}$) is larger, the ratio ($R_{th}/R_o$) of the phase difference in the thickness direction ($R_{th}$) with respect to the in-plane phase difference ($R_o$) at the width center, which will be described below, becomes larger. Accordingly, the rainbow stains can be prevented effectively. But, for PET, the thickness has to be increased to increase the phase difference in the thickness direction ($R_{th}$), which is disadvantageous in terms of cost and film thickness. Accordingly, the upper limit of the phase difference in the thickness direction ($R_{th}$) may be set to 16,000 nm or smaller, specifically 15,000 nm or smaller, more specifically 14,000 nm or smaller.

As described above, as the phase difference in the thickness direction ($R_{th}$) is larger, it is easier to prevent the occurrence of rainbow stains and improve mechanical property. Accordingly, the protective film may have the phase difference in the thickness direction ($R_{th}$) at the width center of 6,800 nm or greater.

And, for the same reason as the in-plane phase difference ($R_o$), it is desired that the protective film has the phase difference in the thickness direction within the effective width ($R_{th,max}-R_{th,min}$) of 1,500 nm/m or smaller, more specifically 1,000 nm/m or smaller, and the change in the phase difference in the thickness direction with respect to the width change ($|\Delta R_{th}|/|\Delta x|$) within the effective width of smaller than 1.5 nm/mm, specifically smaller than 1.3 nm/mm, more specifically smaller than 1.1 nm/mm. The width change refers to the distance between given points along the x-axis ($\Delta x = x_2 - x_1$) and the phase difference in the thickness direction refers to the phase difference in the thickness direction at the between given points ($\Delta R_{th} = R_{th,2} - R_{th,1}$). In the present disclosure, although the unit of the phase difference in the thickness direction with respect to the width change is specified as nm/mm, it does not necessarily mean that the change in the phase difference in the thickness direction is measured based on the distance between two points in mm unit. For example, the change in the phase difference in the thickness direction with respect to the width change may be determined by measuring the change in the in phase difference in the thickness direction for $\Delta x$ set to 1 mm, 1 cm or 10 cm and then converting it to the mm unit. The change in the phase difference in the thickness direction with respect to the width change may refer to a mean of the change in the phase difference in the thickness direction in the given range $\Delta x$, the change in the phase difference in the thickness direction at both ends of the $\Delta x$ or the slope of a tangent line at a given point of a plot of the phase difference in the thickness direction versus $\Delta x$.

In addition to satisfying the in-plane phase difference ($R_o$) and phase difference in the thickness direction ($R_{th}$) conditions described above, the protective film may have the ratio ($R_{th}/R_o$) of the phase difference in the thickness direction ($R_{th}$) with respect to the in-plane phase difference ($R_o$) at the width center of 30 or larger, specifically 50 or larger, more specifically 60 or larger. Because it is easier to prevent the occurrence of rainbow stains as the in-plane phase difference ($R_o$) is smaller and the phase difference in the thickness direction ($R_{th}$) is larger, it is desired to maintain the ratio of the two values ($R_{th}/R_o$) large.

Planar Orientation Coefficient ($\Delta P$) of Protective Film

A planar orientation coefficient ($\Delta P$) is an indicator of a physical property relating to the orientation of polymer molecular chains constituting the protective film. For a film biaxially stretched in the width direction (TD) and the length direction (MD) as the protective film described above, the larger the planar orientation coefficient, the more the polymer molecular chains are oriented perpendicularly to the thickness direction of the film.

The planar orientation coefficient may be calculated by the following equation.

Planar orientation coefficient $\Delta P[-]=(N_x+N_y)/2-N_z$ wherein $N_x$ is the refractive index of the protective film in the width direction, $N_y$ is the refractive index of the protective film in the length direction and the $N_z$ is the refractive index of the protective film in the thickness direction.

The planar orientation coefficient ($\Delta P$) of the protective film may be 0.176 to 0.25, specifically 0.18 to 0.21. If the planar orientation coefficient is smaller than 0.176, the amorphous region may increase significantly due to crystal growth by heat treatment in the state where the protective film is not oriented sufficiently. As a result, the mechanical property may be degraded greatly.

Crystallinity of Protective Film

The present invention provides the protective film which has improved optical property while maintaining the superior mechanical property of PET to be applicable to a polarizing plate used in various applications. Hereunder is given a detailed description.

Specifically, the protective film may have a crystallinity of 35% to 55%. If the crystallinity is lower than 35%, mechanical property such as tensile strength, etc. may be unsatisfactory. And, if it exceeds 55%, the protective film may break easily due to excessive crystallinity.

The crystallinity ($X_c$) is calculated by Equation 1.

$$X_c[\%]=d_c(d-d_a)/d(d_c-d_a)*100 \qquad \text{[Equation 1]}$$

wherein $X_c$ is the crystallinity, $d_c$ is the density (g/cm$^3$) of the crystalline region, $d_a$ is the density (g/cm$^3$) of the amorphous region and d is the density (g/cm$^3$) at the measured site.

In an exemplary embodiment, $d_c$ and $d_a$ are calculated as 1.455 g/cm$^3$ and 1.335 g/cm$^3$, respectively.

Other Mechanical Properties

Specifically, the protective film may have a pencil hardness of 5B or greater. If the pencil hardness is 6B or lower, it may be difficult to protect a polarizer from external force. In an exemplary embodiment, the protective film may further include a hard coating layer on the polarizer. Specifically, the polarizer further including the hard coating layer may have a pencil hardness of 1H or greater.

The protective film may have a tensile modulus at high temperature (85° C.) of specifically 3.0 GPa or greater, more specifically 3.5 GPa or greater.

The protective film is heat-treated after it is introduced to a polarizing plate. If the tensile modulus of the protective film at high temperature (85° C.) is 3.0 GPa or greater, the polarizing plate may be prevented from curling.

Specifically, the polyvinyl alcohol (PVA) used as the polarizer, curls easily during the heat treatment because of high shrinkage. If this is not prevented, wave patterns may occur on the protective film and visibility may be impaired significantly due to glittering. Because the prate film has a high tensile modulus at high temperature (85° C.), the curling of the polyvinyl alcohol (PVA) can be prevented and, therefore, the wave patterns, glittering, separation of the polarizer from the protective film, cracking, etc. can be prevented in advance.

Upon stretching, the protective film has a steric conformation of thermodynamically high energy level. However, if heat is applied to the protective film, fluidity and entropy are increased. As a result, the protective film tends to return to its original size and shape. Heat shrinkage is a physical property indicative of this behavior.

The heat shrinkage may be determined according to the following equation.

Heat shrinkage $Hs[\%]=$(initial length−length after heat treatment)/initial length×100

Specifically, the protective film may have a heat shrinkage of smaller than 1%. If the heat shrinkage is 1% or greater, curling or wrinkling may occur during post-treatment of the polarizing plate having the protective film.

Other Optical Properties

Specifically, the protective film may experience a haze (Hz) of smaller than 1%. If the haze is large, post-treatment processes of the polarizing plate having the protective film such as heating, adhesion, etc. may be limited. It is because the post-treatment process may further increase the haze, thereby impairing visibility.

The protective film may contain various additives such as an electrostatic agent, an antistatic agent, an antiblocking agent, an inorganic lubricant, etc. within the range not impairing the optical property and the mechanical property. In particular, the protective film may contain an UV-absorbing agent to enhance its functionality.

As the UV-absorbing agent, both an organic UV-absorbing agent and an inorganic UV-absorbing agent may be used. Specifically, an UV-absorbing agent may be added to ensure transparency. As the organic UV-absorbing agent, a benzophenol-based and cyclic iminoester-based UV-absorbing agent etc. may be used. Specifically, the protective film may contain one or more UV-absorbing agent selected from a group consisting of 2-[2'-hydroxy-5'-(methacryloyloxymethyl)phenyl]-2H-benzotriazole, 2-[2'-hydroxy-5'-(methacryloxyethyl)phenyl]-2H-benzotriazole, 2-[2'-hydroxy-5'-(methacryloyloxypropyl)phenyl]-2H-benzotriazole, 2,2'-dihydroxy-4,4'-dimethoxybenzophenone, 2,2',4,4'-tetrahydroxybenzophenone, 2,4-di-tert-butyl-6-(5-chlorobenzotriazol-2-yl)phenol, 2-(2'-hydroxy-3'-tert-butyl-5'-methylphenyl)-5-chlorobenzotriazole, 2-(5-chloro(2H)-benzotriazol-2-yl)-4-methyl-6-(tert-butyl)phenol, 2,2'-methylenebis(4-(1,1,3,3-tetramethylbutyl)-6-(2H-benzotriazol-2-yl)phenol, 2,2'-(1,4-phenylene)bis(4H-3,1-benzoxazin-4-one), 2-methyl-3,1-benzoxazin-4-one, 2-butyl-3,1-benzoxazin-4-one and 2-phenyl-3,1-benzoxazin-4-one.

Accordingly, the protective film may have a UV transmittance of lower than 10% at a wavelength of 380 nm and a UV transmittance of lower than 1% at a wavelength of 370 nm.

In the present invention, the protective film may be formed by the following procedure.

(1) Preparation of PET Resin

Because PET resin is easily hydrolyzed, it may be dried sufficiently before being supplied to an extruder.

(2) Melt Extrusion Band Film Formation

The PET resin is melt-extruded and then formed into a sheet by cooling.

Specifically, the melt extrusion may be performed at a temperature in a range from $T_m+30°$ C. to $T_m+60°$ C., wherein $T_m$ (° C.) is the melting point of the PET resin. Through this, productivity may be improved by preventing increase in the viscosity of the melted resin and decrease in the molecular weight of the PET resin and oligomer generation due to thermal depolymerization may be prevented.

The melt-extruded resin is formed into an unstretched sheet by solidification in a casting process. Specifically, the solidification may be performed at a temperature of 30° C. or below, more specifically at 15° C. to 30° C.

(3) Biaxial Stretching

The unstretched sheet may be stretched biaxially in the width direction (TD) and the length direction (MD) to confer desired optical property.

The unstretched sheet may be biaxially stretched through simultaneous biaxial stretching or sequential biaxial stretching. Specifically, the unstretched sheet may be biaxially stretched sequentially by stretching along one direction and then stretching along a direction perpendicular thereto, although not being limited thereto.

The protective film may be formed by stretching the unstretched sheet formed of PET 2.8 times to 3.5 times in the length direction (MD) and 2.9 times to 3.7 times in the width direction (TD).

The protective film may have similar stretching ratios in the length direction (MD) and in the width direction (TD). Therefore, the ratio (MD/TD) of the stretching ratio in the length direction (MD) with respect to the stretching ratio in the width direction (TD) may be 0.9 to 1.1.

And, the protective film may be formed by stretching in the length direction (MD) and in the width direction (TD) at a stretching speed of 6.5 m/min to 8.5 m/min, although not being limited thereto.

The protective film may be preheated to a predetermined temperature before stretching in the length direction (MD) and in the width direction (TD). Specifically, the preheating temperature may be in a range from $T_g+5°$ C. to $T_g+50°$ C. Although stretchability is good as the $T_g$ is lower, fracture may occur. Therefore, the stretching may be performed after preheating to about 78° C.

The protective film formed by stretching under the above condition may have a thickness of 20 μm to 60 μm. Also, the protective film may be fixed through heat treatment after the stretching is completed. The heat treatment may be performed at 160° C. to 230° C.

The polarizing plate according to an exemplary embodiment may be applied for a display device such as a liquid crystal display, an organic electroluminescence display, etc.

The display device includes a display panel and the polarizing plate which is disposed on at least one of the upper side and the lower side of the display panel.

Figure 3:
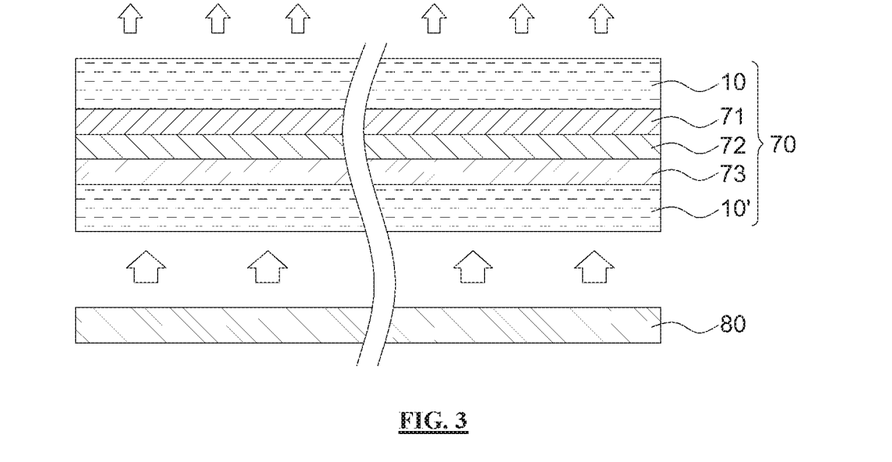
FIG. 3 briefly illustrates a liquid crystal display as an exemplary display panel equipped with a polarizing plate according to an exemplary embodiment.

FIG. 3 briefly illustrates a liquid crystal display as an exemplary display panel equipped with a polarizing plate according to an exemplary embodiment.

The liquid crystal display includes a liquid crystal panel 70 and a backlight unit 80.

The backlight unit 80 emits light to the liquid crystal panel 70. The liquid crystal panel 70 displays images using the light incident from the backlight unit.

The liquid crystal panel 70 includes an upper polarizing plate 10, a color filter substrate 71, a liquid crystal layer 72, a TFT substrate 73 and a lower polarizing plate 10'.

The TFT substrate 73 and the color filter substrate 71 face each other.

The TFT substrate 73 may include a plurality of electrodes corresponding to respective pixels, a thin-film transistor connected to the electrodes, a plurality of gate wirings applying driving signals to the thin-film transistor and a plurality of data wirings applying data signals to the electrodes through the thin-film transistor.

The color filter substrate 71 includes a plurality of color filters corresponding to respective pixels. The color filters create red, green and blue colors by filtering incident light. The color filter substrate may include a common electrode facing the electrodes.

The liquid crystal layer 72 is interposed between the TFT substrate and the color filter substrate. The liquid crystal layer may be driven by the TFT substrate. More specifically, the liquid crystal layer may be driven by an electric field formed between the electrodes and the common electrode. The liquid crystal layer may control the polarization direction of the light passing through the polarizing plate therebelow. That is to say, the TFT substrate may control the potential difference applied between the electrodes and the common electrode in pixel units. Accordingly, the liquid crystal layer may be driven to have different optical properties in pixel units.

The upper polarizing plate 10 is disposed on the color filter substrate 71. The upper polarizing plate 10 may be adhered to the upper side of the color filter substrate 71.

The lower polarizing plate 10' is disposed below the TFT substrate 73. The lower polarizing plate 10' may be adhered to the lower side of the TFT substrate 73.

The polarization directions of the upper polarizing plate 10 and the lower polarizing plate 10' may be identical or perpendicular to each other.

Figure 4:
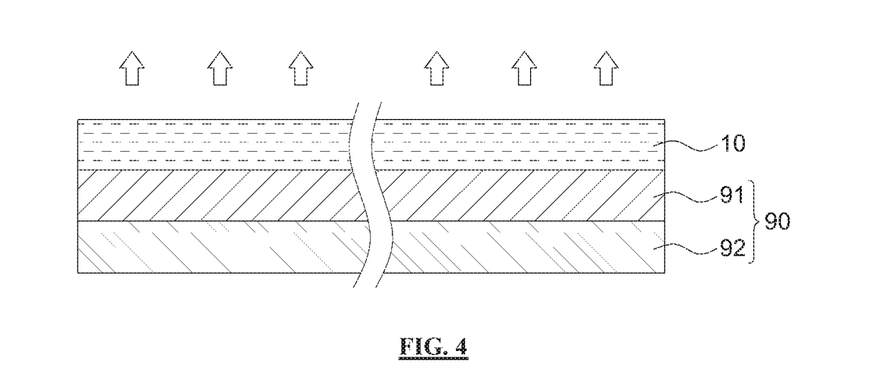
FIG. 4 briefly illustrates an organic electroluminescence display as an exemplary display panel equipped with a polarizing plate according to an exemplary embodiment.

FIG. 4 briefly illustrates an organic electroluminescence display as an exemplary display panel equipped with a polarizing plate according to an exemplary embodiment.

The organic electroluminescence display includes a front polarizing plate 10 and an organic EL panel 90.

The front polarizing plate 10 may be disposed on the front side of the organic EL panel 90. More specifically, the front polarizing plate may be attached the side of the organic EL panel on which images are displayed. The front polarizing plate may have substantially the same constitution as the polarizing plate descried above.

The organic EL panel displays images through luminescence by the pixel units. The organic EL panel includes an organic EL substrate 91 and a driving substrate 92.

The organic EL substrate 91 includes a plurality of organic electroluminescence units corresponding to respective pixels. Each of the organic electroluminescence units includes a cathode, an electron transport layer, a luminescence layer, a hole transport layer and an anode. Detailed description of the cathode, etc. will be omitted.

The driving substrate 92 is drivably coupled to the organic EL substrate 31. That is to say, the driving substrate may be coupled to the organic EL substrate so as to apply driving signals such as driving current, etc. More specifically, the driving substrate may drive the organic EL substrate by applying current to the respective organic electroluminescence units.

MODE FOR THE INVENTION

The present invention will be described in more detail through examples. The following examples are for illustrative purposes only and it will be apparent to those skilled in the art that the scope of this invention is not limited by the examples.

Examples 1 to 5 and Comparative Examples 1 to 4

A polyethylene terephthalate (PET) resin (SKC) was used as a material of a protective film. An unstretched sheet was prepared by extruding the PET resin at about 280° C. using an extruder and casting the same at about 30° C. using a casting roll.

After preheating, the unstretched sheet was stretched at 125° C. in the length direction (MD) and the width direction (TD) with the stretching ratio described in Table 1. Then, a protective film was prepared by heat setting the stretched sheet at the temperature described in Table 1 for about 30 seconds.

TABLE 1

|  | Thickness [μm] | MD stretching ratio | TD stretching ratio | MD stretching ratio/TD stretching ratio | Preheating temperature [° C.] | Heat setting temperature [° C.] |
| --- | --- | --- | --- | --- | --- | --- |
| Example 1 | 40 | 3.3 times | 3.5 times | 0.94 | 78 | 180 |
| Example 2 | 40 | 3.1 times | 3.4 times | 0.91 | 78 | 230 |
| Example 3 | 50 | 3.1 times | 3.4 times | 0.91 | 78 | 230 |
| Example 4 | 40 | 3.5 times | 3.7 times | 0.95 | 78 | 180 |
| Example 5 | 40 | 3.3 times | 3.5 times | 0.94 | 78 | 200 |
| Comparative Example 1 | 30 | 3.1 times | 3.4 times | 0.91 | 78 | 230 |
| Comparative Example 2 | 50 | 3.2 times | 4.2 times | 0.76 | 78 | 230 |
| Comparative Example 3 | 80 | 1.2 times | 4.3 times | 0.28 | 78 | 210 |
| Comparative Example 4 | 40 | 3.2 times | 3.6 times | 0.89 | 78 | 230 |

Measurement Example

The in-plane phase difference ($R_o$), phase difference in the thickness direction ($R_{th}$), in-plane phase difference within the effective width ($R_{o,max}-R_{o,min}$) and phase difference in the thickness direction within the effective width ($R_{th,max}-R_{th,min}$) of the protective films prepared in the examples and comparative examples were measured. The result is given in Table 2.

The in-plane phase difference ($R_o$) and the phase difference in the thickness direction ($R_{th}$) were measured as follows.

After determining the orientation axis of the protective film using two sheets of the polarizing plate, a sample for measurement was prepared by cutting to a size of 4 cm×2 cm perpendicularly to the orientation axis. The in-plane phase difference and the phase difference in the thickness direction were measured using a phase difference meter (Axometrics, Axoscan, measurement wavelength=550 nm). The refractive index of the protective film (sample) was measured using an Abbe refractometer (Atago, NAR-4T, measurement wavelength=546 nm) and the thickness d (μm) of the protective film was measured using an electronic micrometer (Fineloop, Millitron 1245D).

Figure 5A:
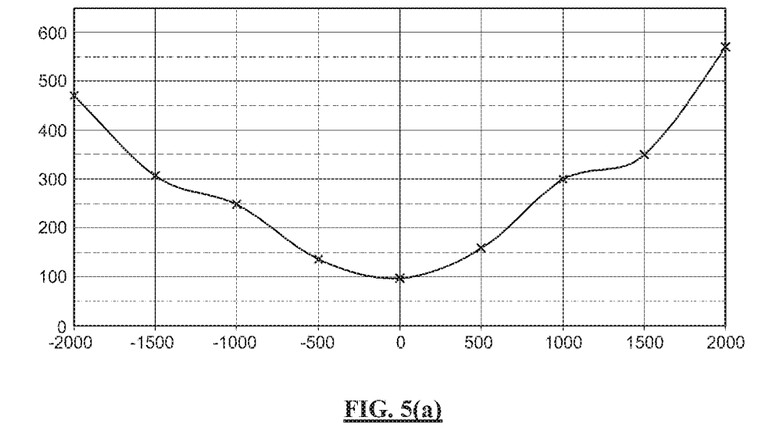
Figure 5B:
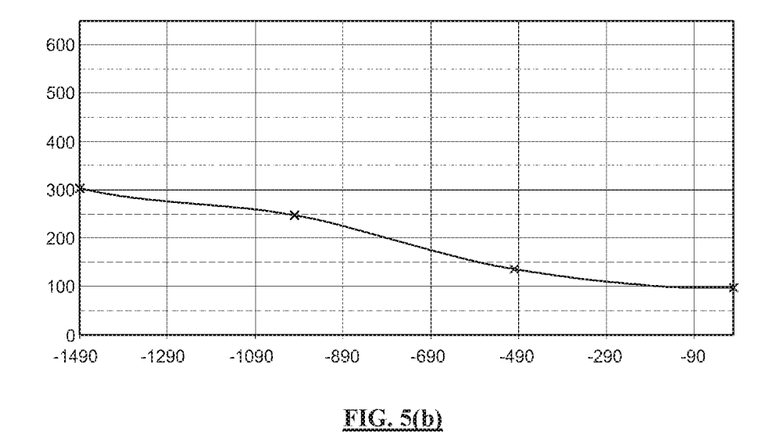
Figure 5C:
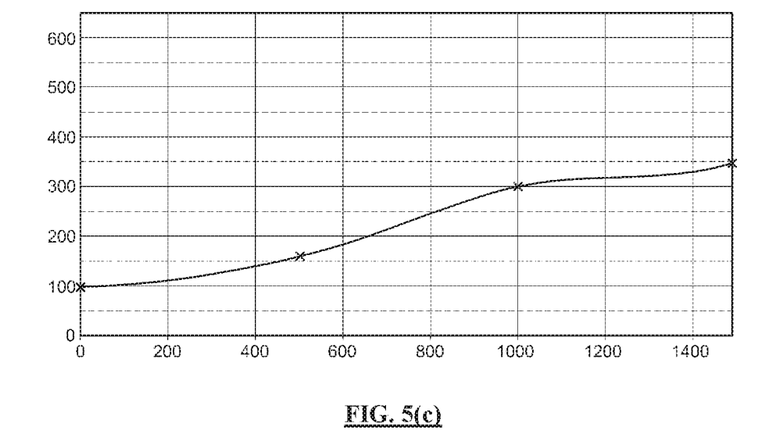
Figure 6A:
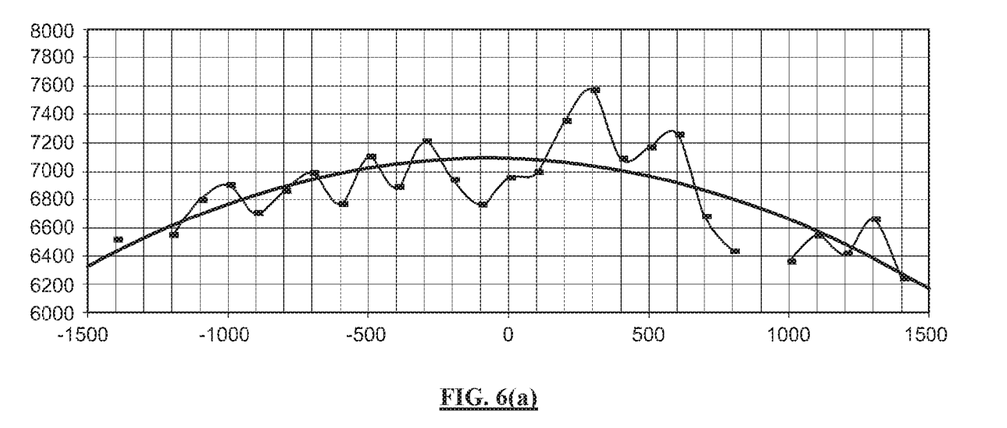
Figure 6B:
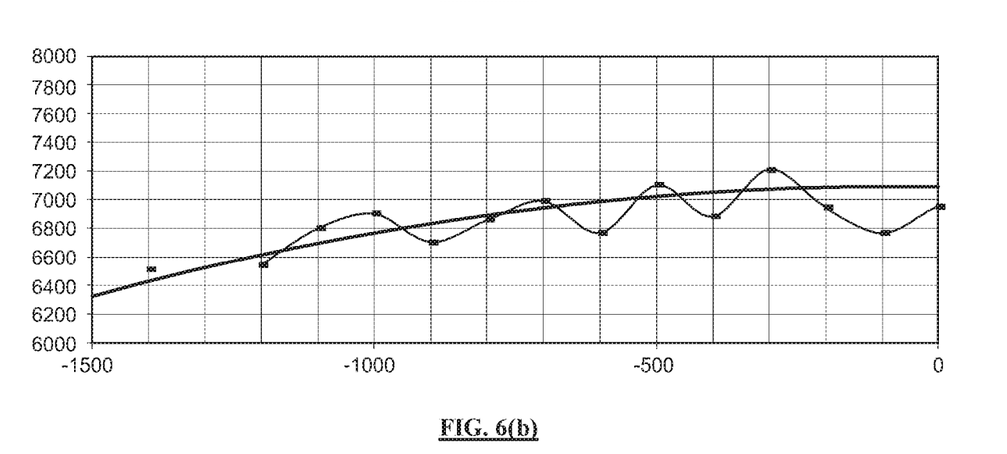
Figure 6C:
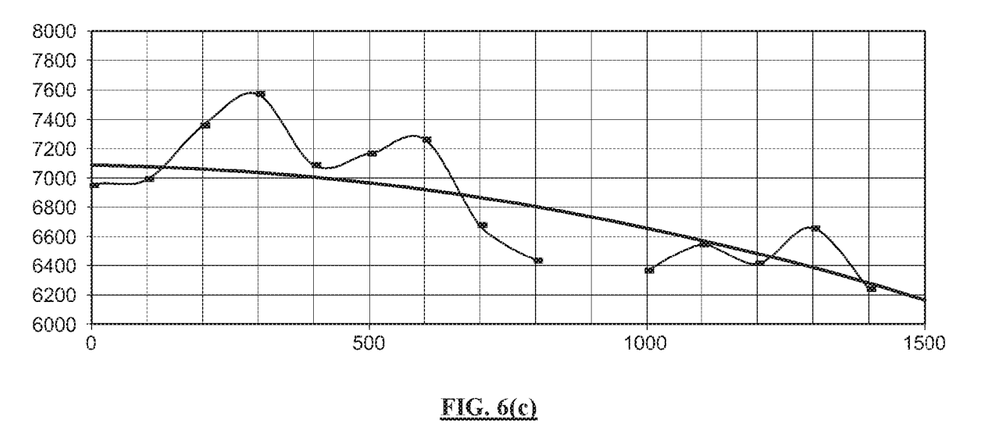

The in-plane phase difference ($R_o$) and the phase difference in the thickness direction ($R_{th}$) were measured for the protective film of Example 1 over the entire effective width. The result is shown in FIG. 5 and FIG. 6.

TABLE 2

| | $R_o{}^{1)}$ [nm] | $R_{th}{}^{2)}$ [nm] | $R_{th}/R_o{}^{3)}$ [nm] | Variation of $R_o$ within effective width[4] [nm/m] |
|---|---|---|---|---|
| Example 1 | 98 | 6,850 | 69.9 | 250 |
| Example 2 | 170 | 6,100 | 35.9 | 320 |
| Example 3 | 160 | 8,200 | 51.3 | 460 |
| Comparative Example 1 | 130 | 5,700 | 43.8 | 270 |
| Comparative Example 2 | 1900 | 10,400 | 5.47 | 420 |
| Comparative Example 3 | 8100 | 7,100 | 0.88 | 100 |
| Comparative Example 4 | 305 | 5,500 | 18.0 | 410 |

[1] In-plane phase difference ($R_o$) at width center
[2] Phase difference in thickness direction ($R_{th}$) at width center
[3] Ratio of phase difference in thickness direction ($R_{th}$) with respect to in-plane phase difference ($R_o$) at width center
[4] Effective width: ±1,500 mm from width center (about 3,000 mm)

Referring to FIG. 5, it can be seen that the protective film of Example 1 satisfies the following conditions.

In-plane phase difference ($R_o$) at the width center ≤100 nm

In-plane phase difference ($R_o$) within ±500 mm from the width center in the width direction ≤160 nm In-plane phase difference ($R_o$) within ±1000 mm from the width center in the width direction ≤300 nm Change in the in-plane phase difference with respect to the width change ($|\Delta R_o|/|\Delta x|$) within the effective width <0.3 nm/mm Referring to FIG. 6, it can be seen that the protective film of Example 1 satisfies the following conditions.

Phase difference in the thickness direction ($R_{th}$) at the width center ≥6,800 nm Change in the phase difference in the thickness direction with respect to the width change ($|\Delta R_{th}|/|\Delta x|$) within the effective width <1.5 nm/mm Test Example The appearance, crystallinity, density, pencil hardness, pencil hardness after hard coating and tensile modulus at high temperature of the protective films of the examples and comparative examples were evaluated after application to a display device. The result is given in Table 3 and Table 4.

The appearance was evaluated as follows.

The protective films of the examples and comparative examples were introduced to a polarizing plate with a structure shown in FIG. 1. Then, a hard coating layer was formed on the protective film. After applying the resulting polarizing plate to a TV or a monitor, it was visually evaluated whether rainbow stains or coloring from the front and oblique directions of the polarizing plate.

⊚: No rainbow stain or coloring is observed from any direction.

O: No rainbow stain is observed from any direction but very slight coloring is observed from an oblique direction.

Δ: Slight rainbow stains and coloring are observed from an oblique direction.

X: Clear rainbow stains and coloring are observed from an oblique direction.

The crystallinity of the protective film was measured by the density method described above (Equation 1).

The pencil hardness of the protective film was measured using a pencil hardness tester (Kipae E&T, KP-M5000M) and a Mitsubishi 'UNI' grade pencil. The pencil hardness was also measured after forming the hard coating layer on the protective film.

The tensile modulus of the protective film was measured using a universal testing machine (Instron, 4485 TIC960203-97B1A).

TABLE 3

| | Appearance on TV | Appearance on monitor | Density [g/cm³] | Crystallinity [%] | Pencil hardness | Pencil hardness after H/C |
|---|---|---|---|---|---|---|
| Example 1 | ⊚ | ⊚ | 1.388 | 44 | 5B | 2H |
| Example 2 | O | ⊚ | 1.397 | 52 | 5B | 2H |
| Example 3 | ⊚ | ⊚ | 1.397 | 52 | 5B | 2H |
| Comparative Example 1 | X | ⊚ | 1.398 | 53 | 6B | 1H |
| Comparative Example 2 | X | Δ | 1.405 | 58 | 4B | 2H |
| Comparative Example 3 | ⊚ | ⊚ | 1.397 | 43 | 5B | 2H |
| Comparative Example 4 | X | ⊚ | 1.401 | 55 | 5B | 2H |

TABLE 4

| | Tensile modulus (@ 85° C.) | | Visibility[1] | |
|---|---|---|---|---|
| | MD [GPa] | TD [GPa] | Length direction | Width direction |
| Example 1 | 3.7 | 3.8 | O | O |
| Example 2 | 3.7 | 4.0 | O | O |
| Example 3 | 3.8 | 3.9 | O | O |
| Comparative Example 1 | 4.0 | 4.1 | X | Δ |
| Comparative Example 2 | 3.8 | 4.2 | O | O |
| Comparative Example 3 | 2.2 | 5.8 | X | O |
| Comparative Example 4 | 3.8 | 4.0 | O | O |

[1] Visibility was evaluated based on the occurrence of wave patterns and glittering. The evaluation standard was as follows.
O: no decrease in visibility,
Δ: slight decrease in visibility,
X: severe decrease in visibility.

Referring to Table 3 and Table 4, it can be seen that the protective films of Examples 1-3 can be used for various applications because they showed good crystallinity, pencil hardness and tensile modulus while having superior optical property with no rainbow stain or coloring.

In particular, it can be seen that the protective film of Example 1 showed well-balanced optical property and mechanical property and, thus, is the most suitable for application to a polarizing plate for a display device.

As another example for preventing rainbow stains by improving the optical property of the protective film, the present invention provides a protective film which contains polyethylene terephthalate (PET) as a main component and further contains a specific amount of polyethylene naphthalate (PEN).

The addition of the polyethylene naphthalate (PEN) may lead to prevention of rainbow stains as the crystallinity of the protective film is decreased, the variation of the in-plane phase difference ($R_{o,max}$–$R_{o,min}$) at the width direction is decreased greatly and the phase difference in thickness direction ($R_{th}$) is increased greatly. In addition, the protective film may be used for various applications because it is not necessary to increase the thickness of the protective film in order to increase the phase difference in thickness direction ($R_{th}$).

The protective film may contain 90 wt % to 97 wt % of the polyethylene terephthalate (PET) and 3 wt % to 10 wt % of the polyethylene naphthalate (PEN). If the content of the polyethylene naphthalate is less than 3 wt %, the function of blocking UV is decreased and the phase difference in thickness direction cannot be increased. And, if the content of the polyethylene naphthalate exceeds 10 wt %, optical distortion such as rainbow stains may occur because the variation of the in-plane phase difference is increased.

The protective film has an effect of blocking UV because it contains the polyethylene naphthalate (PEN). Specifically, the protective film may have a UV (wavelength=300 nm to 380 nm) transmittance of smaller than about 20%.

Accordingly, the protective film may exhibit a sufficient UV-blocking effect even when no additional UV-absorbing agent is added. In addition, even when the UV-absorbing agent is added to further increase the UV-blocking effect, it may be economical because the addition amount may be decreased.

As the UV-absorbing agent, both an organic UV-absorbing agent and an inorganic UV-absorbing agent may be used. Specifically, an UV-absorbing agent may be added to ensure transparency. As the organic UV-absorbing agent, a benzophenol-based and cyclic iminoester-based UV-absorbing agent etc. may be used. Specifically, the protective film may contain one or more UV-absorbing agent selected from a group consisting of 2-[2'-hydroxy-5'-(methacryloyloxymethyl)phenyl]-2H-benzotriazole, 2-[2'-hydroxy-5'-(methacryloyloxyethyl)phenyl]-2H-benzotriazole, 2-[2'-hydroxy-5'-(methacryloxypropyl)phenyl]-2H-benzotriazole, 2,2'-dihydroxy-4,4'-dimethoxybenzophenone, 2,2',4,4'-tetrahydroxybenzophenone, 2,4-di-tert-butyl-6-(5-chlorobenzotriazol-2-yl)phenol, 2-(2'-hydroxy-3'-tert-butyl-5'-methylphenyl)-5-chlorobenzotriazole, 2-(5-chloro(2H)-benzotriazol-2-yl)-4-methyl-6-(tert-butyl)phenol, 2,2'-methylenebis(4-(1,1,3,3-tetramethylbutyl)-6-(2H-benzotriazol-2-yl)phenol, 2,2'-(1,4-phenylene)bis(4H-3,1-benzoxazin-4-one), 2-methyl-3,1-benzoxazin-4-one, 2-butyl-3,1-benzoxazin-4-one and 2-phenyl-3,1-benzoxazin-4-one.

The protective film containing a small amount of the UV-absorbing agent may have a UV transmittance of lower than 10% at a wavelength of 380 nm and a UV transmittance of lower than 1% at a wavelength of 370 nm.

The protective film has the in-plane phase difference ($R_o$) of 350 nm or smaller, the phase difference in thickness direction ($R_{th}$) of 7,000 nm or greater and the variation of the in-plane phase difference ($R_{o,max}$–$R_{o,min}$) in the width direction of 300 nm or smaller.

In the present invention, the protective film may be formed by the following procedure.

(1) Preparation of Polyethylene Terephthalate (PET) and Polyethylene Naphthalate (PEN)

Because polyethylene terephthalate (PET) is easily hydrolyzed, it may be dried sufficiently before being supplied to an extruder.

(2) Melt Extrusion Band Film Formation

Polyethylene terephthalate (PET) and polyethylene naphthalate (PEN) are melt-extruded and then formed into a sheet by cooling.

Specifically, the melt extrusion may be performed at a temperature in a range from $T_m$+30° C. to $T_m$+60° C., wherein $T_m$ (° C.) is a melting point. Through this, productivity may be improved by preventing increase in the viscosity of the melted resin and decrease in the molecular weight and oligomer generation due to thermal depolymerization may be prevented.

The melt-extruded product is formed into an unstretched sheet by solidification in a casting process. Specifically, the solidification may be performed at a temperature of 30° C. or below, more specifically at 15° C. to 30° C.

(3) Biaxial Stretching

The unstretched sheet may be stretched biaxially in the width direction (TD) and the length direction (MD) to confer desired optical property.

The unstretched sheet may be biaxially stretched through simultaneous biaxial stretching or sequential biaxial stretching. Specifically, the unstretched sheet may be biaxially stretched sequentially by stretching along one direction and then stretching along a direction perpendicular thereto, although not being limited thereto.

The protective film may be formed by stretching the unstretched sheet formed of PET 2.5 times to 6 times in the length direction (MD) and 2.5 times to 6 times in the width direction (TD).

The stretching ratio is an important factor greatly affecting the heat shrinkage, density, crystallization behavior, thermal behavior and optical property of the protective film. Specifically, the ratio (TD/MD) of the stretching ratio in the width direction (TD) with respect to the stretching ratio in the length direction (MD) may be 0.9 to 1.3, more specifically 1.04 to 1.1.

And, the protective film may be formed by stretching in the length direction (MD) and in the width direction (TD) at a stretching speed of 6.5 m/min to 8.5 m/min, although not being limited thereto.

The unstretched sheet may be preheated to a predetermined temperature before stretching in the length direction (MD) and in the width direction (TD). Specifically, the preheating temperature may be in a range from $T_g$+5° C. to $T_g$+50° C. Although stretchability is good as the $T_g$, is lower, fracture may occur. Specifically, the preheating temperature before stretching in the length direction (MD) may be 90° C. to 100° C. and the preheating temperature before stretching in the width direction (TD) may be 120° C. to 150° C.

(4) Heat Setting

Heat setting may be performed for the protective film.

The heat setting may be performed at a temperature of 150° C. to 260° C. or at a temperature of 170° C. to 230° C. Also, the heat setting may be performed at a temperature of 180° C. to 230° C. or at a temperature of 180° C. to 200° C. When the heat setting temperature is within the above-described ranges, it may be more advantageous in preventing rainbow stains while lowering the phase difference in the thickness direction of the film.

The heat setting may be performed for about 5 seconds to 1 minute, more specifically for about 10 seconds to 45 minutes.

After the heat setting begins, the protective film may be relaxed with respect to the length direction and/or the width direction.

The protective film may be stretched and heat-set such that the final thickness is 20 μm to 60 μm. As described above, because the protective film is formed by adding polyethylene naphthalate (PEN) to polyethylene terephthalate (PET), occurrence of rainbow stains may be prevented due to the large phase difference in the thickness direction ($R_{th}$) even when the thickness is 60 μm or smaller.

Examples 6 to 8 and/Comparative Examples 5 and 6

A polyethylene terephthalate (PET) resin and a polyethylene naphthalate (PEN) resin (SIC) with contents described in Table 5 were melt-extruded and formed into an unstretched sheet using a casting roll.

A protective film was prepared by stretching and heat-setting the unstretched sheet under the conditions described in Table 5.

TABLE 5

| | PET [wt %] | PEN [wt %] | Thickness [μm] | Length direction (MD) stretching | | Width direction (TD) stretching | | Heat setting temp. [° C.] |
|---|---|---|---|---|---|---|---|---|
| | | | | Preheating temperature | Stretching ratio | Preheating temperature | Stretching ratio | |
| Ex. 6 | 97 | 3 | 40 | 90° C. | 3.2 times | 150° C. | 3.4 times | 190 |
| Ex. 7 | 95 | 5 | 40 | 94° C. | 3.2 times | 150° C. | 3.4 times | 190 |
| Ex. 8 | 90 | 10 | 40 | 98° C. | 3.2 times | 150° C. | 3.4 times | 200 |
| Comp. Ex. 5 | 100 | 0 | 40 | 78° C. | 3.2 times | 150° C. | 3.4 times | 190 |
| Comp. Ex. 6 | 100 | 0 | 40 | 78° C. | 3.2 times | 150° C. | 4.1 times | 230 |

The in-plane phase difference ($R_o$), variation of the in-plane phase difference ($R_{o,max}-R_{o,min}$) in the width direction, phase difference in the thickness direction ($R_{th}$), planar orientation coefficient (ΔP) and ratio ($N_z$) of the phase difference in the thickness direction with respect to the in-plane phase difference of the protective films prepared in the examples and comparative examples were measured. The result is given in Table 6 and 7.

TABLE 6

| | In-plane phase difference ($R_o$, nm) | | | | Phase difference in thickness direction ($R_{th}$, nm) | | | |
|---|---|---|---|---|---|---|---|---|
| | −1,000 mm | 0 mm | +1,000 mm | Variation | −1,000 mm | 0 mm | +1,000 mm | Variation |
| Example 6 | 220 | 119 | 310 | 191 | 7,326 | 7,612 | 7,351 | 286 |
| Example 7 | 190 | 124 | 265 | 141 | 7,689 | 8,124 | 7,745 | 435 |
| Example 8 | 245 | 110 | 274 | 164 | 7,754 | 8,259 | 8,123 | 505 |
| Comparative Example 5 | 325 | 98 | 410 | 312 | 6,954 | 6,842 | 7,450 | 608 |
| Comparative Example 6 | 1,987 | 2,152 | 2,458 | 471 | 6,954 | 6,500 | 7,745 | 1,245 |

TABLE 7

| | $N_z$ | | | Planar orientation coefficient | | |
|---|---|---|---|---|---|---|
| | −1,000 mm | 0 mm | +1,000 mm | −1,000 mm | 0 mm | +1,000 mm |
| Example 6 | 33.3 | 63.97 | 23.71 | 0.183 | 0.190 | 0.184 |
| Example 7 | 40.5 | 65.52 | 29.22 | 0.192 | 0.203 | 0.194 |
| Example 8 | 31.6 | 75.08 | 29.65 | 0.194 | 0.206 | 0.203 |
| Comparative Example 5 | 21.4 | 69.82 | 18.17 | 0.174 | 0.171 | 0.186 |
| Comparative Example 6 | 3.5 | 3.02 | 3.15 | 0.174 | 0.163 | 0.194 |

Referring to Table 6 and Table 7, it can be seen that the protective films of Examples 6 to 8 satisfy the following conditions.

In-plane phase difference ($R_o$) ≤1350 nm

Phase difference in thickness direction ($R_{th}$) ≥7,000 nm

Variation of in-plane phase difference ($R_{o,max}-R_{o,min}$) in width direction ≤300 nm Ratio ($R_{th}/R_o$) of phase difference in thickness direction ($R_{th}$) with respect to in-plane phase difference ($R_o$) ≥25

Planar orientation coefficient (ΔP): 0.176 to 0.25

The appearance (occurrence of rainbow stains), UV transmittance, haze and heat shrinkage of the protective films of the examples and comparative examples were evaluated after application to a display device. The result is given in Table 8.

The occurrence of rainbow stains was measured as follows.

After inserting the protective film to be tested between two sheets of PVA-based polarizing plates, the occurrence of rainbow stains was observed with naked eyes. The occurrence of rainbow stains was evaluated in a horizontal view angle range of 0° to 180°. The two sheets of polarizing plates were aligned so that their polarization axes are perpendicular each other. The tested film was aligned such that its polarization axis matched that of one of the two polarizing plates.

The haze was measured as follows.

The protective film was put in an open box and heat-treated at 150° C. for 10 minutes, 20 minutes or 30 minutes, so that oligomers moved toward the film surface. After 5 minutes, the haze was measured using a haze meter according to the JIS K 715 standard.

The UV transmittance was measured as mean UV transmittance in a wavelength range of 300 nm to 380 nm.

The heat shrinkage was measured as follows.

The protective film was cut to a size of 300 mm×300 mm and heat-treated in an oven at 85° C. for 24 hours. Then, the heat shrinkage was calculated according to the following equation.

Heat shrinkage $Hs[\%]$=(initial length −length after heat treatment)/initial length×100

TABLE 8

| | Occurrence of rainbow stains | | | UV transmittance [%] | Haze [%] | Heat shrinkage [%] |
|---|---|---|---|---|---|---|
| | −90° | 0° | +90° | | | |
| Example 6 | X | X | X | 18 | 0.7 | 0.6 |
| Example 7 | X | X | X | 13 | 0.54 | 0.5 |
| Example 8 | X | X | X | 11 | 0.65 | 0.75 |
| Comparative Example 5 | O | X | Δ | 67 | 0.8 | 0.6 |
| Comparative Example 6 | O | O | O | 68 | 0.8 | 0.34 |

Referring to Table 8, the protective films of Examples 6 to 8 showed no rainbow stains in the horizontal view angle range of 0° to 180°, had a UV transmittance of less than 20%, a haze of lower than 1% and a heat shrinkage of less than 1%. In contrast, the protective films of Examples 5 and 6 showed rainbow stains and had a very poor UV-blocking effect.

The protective film according to the present invention has good visibility because rainbow stains are not formed due to small variation of the in-plane phase difference in the width direction and large phase difference in the thickness direction. Also, the phase difference in the thickness direction may be increased without having to increase the thickness by introducing polyethylene naphthalate (PEN). In addition, the protective film according to the present invention has superior UV-blocking effect as it is. Also, it has good visibility due to low haze and does not impair workability in the post-treatment process due to low heat shrinkage.

The present invention has been described in detail with reference to specific embodiments thereof. However, it will be appreciated by those skilled in the art that various changes and modifications may be made in these embodiments without departing from the principles and spirit of the invention, the scope of which is defined in the appended claims and their equivalents.

DESCRIPTION OF ELEMENTS

10: polarizing plate 11: polarizer 12: protective film for polarizer

The invention claimed is:

1. A protective film for a polarizer, which comprises polyethylene terephthalate (PET), satisfies the following conditions (1) and (2):
   (1) in-plane phase difference $(R_o) \leq 350$ nm
   (2) phase difference in thickness direction $(R_{th}) \geq 6{,}000$ nm,
   has a crystallinity of 35% to 55%, and
   has a planar orientation coefficient $(\Delta P)$ of 0.176 to 0.25.

2. The protective film for a polarizer according to claim 1, which has a density of 1.3 g/cm$^3$ to 1.5 g/cm$^3$.

3. The protective film for a polarizer according to claim 1, which has a tensile modulus (85° C.) of 3.0 GPa to 5.0 GPa.

4. The protective film for a polarizer according to claim 1, which has a difference of a modulus (85° C.) in the width direction (TD) and a modulus (85° C.) in the length direction (MD) of smaller than 0.3 GPa.

5. The protective film for a polarizer according to claim 1, which has a pencil hardness of 5B or greater.

6. The protective film for a polarizer according to claim 1, which has an in-plane phase difference $(R_o)$ at the width center of 200 nm or smaller.

7. The protective film for a polarizer according to claim 1, which has a phase difference in thickness direction $(R_{th})$ at the width center of 6,800 nm or greater.

8. The protective film for a polarizer according to claim 1, which has a ratio $(R_{th}/R_o)$ of the phase difference in thickness direction $(R_{th})$ with respect to the in-plane phase difference $(R_o)$ at the width center of 60 or greater.

9. The protective film for a polarizer according to claim 1, which has a variation of the in-plane phase difference $(R_{o,max} - R_{o,min})$ within the effective width of 250 nm/m or smaller.

10. The protective film for a polarizer according to claim 1, which has a variation of the phase difference in thickness direction $(R_{th,max} - R_{th,min})$ within the effective width of 1,500 nm/m or smaller.

11. The protective film for a polarizer according to claim 1, which experiences a change in the in-plane phase difference with respect to the width change $(|\Delta R_o|/|\Delta x|)$ within the effective width of smaller than 0.3 nm/mm.

12. The protective film for a polarizer according to claim 1, which experiences a change in the phase difference in thickness direction with respect to the width change $(|\Delta R_{th}|/|\Delta x|)$ within the effective width of smaller than 1.5 nm/mm.

13. The protective film for a polarizer according to claim 1, which has a stretching ratio in the length direction (MD) of 2.8 times to 3.5 times and a stretching ratio in the width direction (TD) of 2.9 times to 3.7 times.

14. The protective film for a polarizer according to claim 1, which has a ratio (MD/TD) of a stretching ratio in the length direction (MD) with respect to a stretching ratio in the width direction (TD) of 0.9 to 1.1.

15. The protective film for a polarizer according to claim 1, which has a thickness of 20 μm to 60 μm.

16. The protective film for a polarizer according to claim 1, which has a heat setting temperature of 160-230° C.

17. A polarizing plate which comprises a polarizer and the protective film for a polarizer according to any one of claims 1 to 16 which is adjacent to at least one of the upper side and the lower side of the polarizer.

18. The polarizing plate according to claim 17, which further comprises a hard coating layer formed on the protective film and has a pencil hardness of 1H or greater.

19. A display device which comprises a display panel and the polarizing plate according to claim 17 which is disposed on at least one of the upper side and the lower side of the display panel.

* * * * *